United States Patent [19]
Grinberg et al.

[11] Patent Number: 5,304,816
[45] Date of Patent: Apr. 19, 1994

[54] ARTICLE COMPRISING A "BALLISTIC" HETEROJUNCTION BIPOLAR TRANSISTOR

[75] Inventors: Anatoly A. Grinberg, Plainfield; Serge Luryi, Bridgewater, both of N.J.

[73] Assignee: AT&T Bell Laboratories, Murray Hill, N.J.

[21] Appl. No.: 981,588

[22] Filed: Nov. 25, 1992

[51] Int. Cl.$^5$ .......................................... H01L 29/70
[52] U.S. Cl. ..................................... 257/26; 257/27; 257/29; 257/197; 257/198
[58] Field of Search .................... 257/197, 198, 26, 27, 257/29, 23

[56] References Cited

U.S. PATENT DOCUMENTS

| | | | |
|---|---|---|---|
| 4,829,343 | 5/1989 | Levi | 357/4 |
| 4,866,488 | 9/9189 | Frensley | 257/198 |
| 4,958,208 | 9/1990 | Tanaka | 257/12 X |
| 5,006,912 | 4/1991 | Smith et al. | 257/197 X |
| 5,198,689 | 3/1993 | Fujioka | 257/197 |
| 5,206,524 | 4/1993 | Chen et al. | 257/29 |

OTHER PUBLICATIONS

Chen et al., "Subpicosecond InP/InGaAs Heterostructure Bipolar Transistors," IEEE Electron Device Letters, vol. 10, No. 6, Jun. '89, pp. 267–269.

Tiwari, "Frequency Dependence of the Unilateral Gain in Bipolar Transistors," IEEE Electron Device Letters, vol. 10, No. 12, Dec. 1989, pp. 574–576.

Dagli, "A Unipolar Transistor with Negative Output Resistance," Solid–State Electronics, vol. 33, No. 7, 1990, pp. 831–836.

Wright, "Small-Signal Theory of the Transistor Transit-Time Oscillator (Translator)," Solid–State Electronics, vol.22, 1979, pp. 399–403.

Burghartz et al., "Self-Aligned SiGe-Base Heterojunction Bipolar Transistor by Selective Epitaxy Emitter Window (SEEW) Technology", IEEE Electron Device Letters, vol. 11, No. 7, Jul. 1990, pp. 288–289.

S. M. Sze, "Physics of Semiconductor Devices", 2nd Ed., John Wiley & Sons, 1981, Chapter 3.

G. T. Wright, "Small-Signal Theory of the Transistor Transistor Transit-Time Oscillator (Translator)", Solid State Electronics, vol. 22, pp. 399–403, 1979.

S. Tiwari, "Frequency Dependence of the Unilateral Gain in Bipolar Transistors", IEEE Electron Device Letters, vol. 10, p. 574, 1989.

Y. K. Chen, et al., "Subpicosend InP/InGaAs Heterostructure Bipolar Transistors", IEEE Electron Device Letters, EDL-10, No. 6, p. 267, 1989.

N. Dagli, "A Unipolar Transistor With Negative Output Resistance", Solid State Electronics, vol. 33, No. 7, pp. 831–836, 1990.

A. A. Grinberg, et al., "Ballistic Versus Diffusive Base Transport in the High–Frequency Characteristics of Bipolar Transistors", Applied Physics Letters, vol. 60, pp. 2270–2272, 1992.

Primary Examiner—William Mintel
Attorney, Agent, or Firm—Eugen E. Pacher

[57] ABSTRACT

The disclosed heterojunction bipolar transistor, to be referred to as the "coherent" transistor (CT), is capable of providing gain above the conventionally defined cut-off frequencies $f_T$ and $f_{max}$. Substantially, monoenergetic (average energy $\Delta$) carriers are injected in beam-like fashion into the base, with $kT < \Delta < h\nu_{opt}$, where k, T and h have their conventional meaning, and $\nu_{opt}$ is the frequency of the lowest relevant optical phonon in the base of width $W_B$. Exemplarily, $W_B$ is about 100 nm, $\Delta$ is about 20 meV, the CT comprises $Si_{1-x}$-$Ge_x$ or III/V material, with the base being doped n-type. The CT utilizes substantially collisionless minority carrier transport through the base, and is designed such that, at an operating temperature which typically is $\lesssim 77K$, the variance of the average base transit time ($\Delta\tau_B$) is much less than the base transit time $\tau_B$, typically less than 0.5 $\tau_B$, preferably about $\tau_B/5$ or less. Transistors according to the invention typically will have an operating frequency in the range 100 GHz–1THz, and can be advantageously used in many areas of technology, e.g., high speed computing or communications.

7 Claims, 3 Drawing Sheets

ARTICLE COMPRISING A "BALLISTIC" HETEROJUNCTION BIPOLAR TRANSISTOR

FIELD OF THE INVENTION

This application pertains to heterojunction bipolar transistors (HBTs).

BACKGROUND OF THE INVENTION

Since the invention of the transistor in 1947, much effort has been directed towards extension of the device operating range towards higher and higher frequencies.

Conventionally, the cut-off frequency $f_T$ (defined as the frequency at which the current gain $\beta$, i.e., the absolute value of the parameter $h_{fe} \equiv \partial J_c/\partial J_B$, is unity) is used as a figure of merit that is indicative of the high frequency capability of a transistor. See for instance, S. M. Sze, "Physics of Semiconductor Devices", 2nd Edition, John Wiley & Sons, 1981, Chapter 3, incorporated herein by reference. It is well known that $\beta$ at high frequencies decreases at a value of 10 dB/decade.

Another parameter that can be used to characterize the high frequency capabilities of a (typically microwave) transistor is the unilateral (power) gain U. See S. M. Sze, op. cit., pp. 160–165. The frequency at which the unilateral gain is unity is the maximum oscillating frequency $f_{max}$, which can, but need not, be larger than $f_T$. Both $f_T$ and $f_{max}$ are conventionally determined by extrapolation of the measured roll-off in $h_{fe}$ and U, respectively.

G. T. Wright, (see, for instance, *Solid State Electronics*, Vol. 22, p. 399, 1979) proposed extension of active transistor operation of frequencies beyond the conventional cutoff frequency $f_T$. The proposal involved the utilization of transit time resonances that arise from carrier drift in the collector space charge region. The proposed model suggested for an ideal transistor (i.e., a transistor without any parasitic impedances) the possibility that |U| could exceed unity at frequencies above $f_{max}$. However, it has now been shown (S. Tiwari, *IEEE Electron Device Letter*, Vol. 10, No. 12, p. 574, 1989) that the proposed utilization of transit time resonances in a conventional GaAs/AlGaAs HBT would require reductions of each of the base and collector resistances and of the collector capacitance by at least an order of magnitude from state of the art values. Clearly, the proposed mechanism is, at least for the foreseeable future, not likely to be embodied in a practical device. To the best of our knowledge, transit time resonances of the prior art type were not considered with regard to hot electron HBTs. N. Dagli, (*Solid State Electronics*, Vol. 33 (7), p. 831) proposed a hot electron unipolar transit time transistor.

HBTs with substantially collisionless base transport are known. See, for instance, U.S. Pat. No. 4,829,343. Herein free carrier (not necessarily electron) base transport is considered to be "ballistic" if the mean free path ($\Lambda$) of the carriers in the base material is $\gtrsim W_B$, the base width. As those skilled in the art know, the mean free path can, at least in principle, be determined by transport measurements in a magnetic field.

The cut-off frequency of a prior art ballistic HBT cannot be less than $(2\pi\tau_B)^{-1}$, where $\tau_B$ is the average base transit time of the minority carriers. Therefore, prior art ballistic HBTs are typically designed to minimize $\tau_B$. This generally involves maximizing carrier velocity through choice of low effective mass minority carriers (almost invariably resulting in the choice of n-p-n III/V transistors), and through choice of a design that exhibits a relatively large value of the parameter $\Delta$, the injection energy. It also typically involves minimization of the base width $W_B$.

Although HBTs having $f_T$ substantially above 100 GHz have recently been reported (see, for instance, Y. K. Chen, et al. *IEEE Electron Dev. Lett.*, Vol. 10, No. 6, p. 267, 1989), it would clearly be highly desirable to have available transistors that can operate at even higher frequencies. This application discloses such a transistor. The novel device, to be referred to as the coherent transistor (CT), has utility in many fields, e.g., high speed computation or communications.

SUMMARY OF THE INVENTION

Broadly speaking, the invention is a novel HBT that can exhibit power gain (preferably also current gain) at frequencies above the conventionally defined $f_T$ and $f_{max}$.

More specifically, the invention typically is embodied in an article that comprises a HBT that compromises first, second and third semiconductor regions, to be referred to as emitter, base and collector, respectively. The article also comprises means for electrically contacting the emitter, base and collector, respectively. The base is intermediate the emitter and collector and has a width $W_B$. The emitter and collector each comprises material of a first conductivity type, and the base comprises material of a second conductivity type. Associated with the transistor is a current gain $\beta$, a unilateral power gain U, and conventional cut-off frequencies $f_T$ and $f_{max}$. Significantly, the transistor is selected such that $\Delta\tau_B$ is less than about 0.5 $\tau_B$, where $\Delta\tau_B$ is the variance of $\tau_B$, and such that the absolute value of U is greater than unity at least at one frequency above $f_{max}$ and $f_T$.

Typically, in a transistor according to the invention, the minority carriers are injected into the base over a (typically relatively abrupt) barrier, with the average injection energy $\Delta$ of the carriers being selected such that $kT < \Delta < h\nu_{opt}$, where k is the Boltzmann constant, T is the absolute temperature of the transistor during operation, h is Planck's constant, and $\nu_{opt}$ is the frequency of the lowest optical phonon in the base material. In preferred embodiments, $\Delta \gtrsim 3$ kT. Since $h\nu_{opt}$ is, exemplarily, about 59 meV in Si and about 38 meV in GaAs, it can be readily seen that typically $T \lesssim 77K$.

A significant aspect of the invention is substantially collimated (in the forward direction) injection of substantially mono-energetic minority carriers into the base, and substantially ballistic transport of these carriers through the base to the base/collector junction. This is expressed by the requirement that $\Delta\tau_B$ is much less than $\tau_B$ (preferably, $\Delta\tau_B \lesssim \tau_B/5$) where $\tau_B$ is the average base transit time for the carriers, and $\Delta\tau_B$ is the variance of $\tau_B$. Operation of the transistor at cryogenic temperatures, together with the choice of injection energy less than the energy of any relevant optical phonon can result in a ballistic scattering length (herein equivalent to $\Lambda$) of about 100 nm or even more. Furthermore, $\Delta\tau_B$ typically is proportional to T, as those skilled in the art know. Thus, the condition that $\Delta\tau_B$ is substantially less than $\tau_B$ can, in general, be readily met by appropriate choice of operating temperature.

Since the injected carriers have average energy $\Delta$, $\tau_B = W_B (2\Delta/m)^{-\frac{1}{2}}$, where m is the effective minority carrier mass in the base and $\Delta\tau_B = (<\tau_B^2> - <\tau_B>^2)^{\frac{1}{2}}$, where the brackets signify the ensemble average of the variable within the brackets. The quantities $\tau_B$ and $\Delta\tau_B$ thus are well defined and also determinable for any particular transistor according to the invention. For instance, for the typical case of a thermal distribution of carriers on the top of the barrier, it is known that $(\Delta\tau_B/\tau_B)$ is approximately equal to $(kT/2\Delta)$.

A HTB that meets the fundamental requirement $\Delta\tau_B << \tau_B$ will herein be referred to as a "coherent" transistor (CT) since, in such a device, a minority carrier pulse experiences relatively little dispersion during its propagation through the base. We have discovered that a CT can exhibit (current and/or power) gain at frequencies above $f_T$ and $f_{max}$, thus making possible operation at previously unattainable frequencies.

As will be shown in more detail below, an ideal CT (neglecting extrinsic impedances and also neglecting a transit delay $\theta$ in the base/collector junction) has current gain $\beta > 1$ in a set of resonant bands of frequencies centered at $f_n = 2\pi n f_T$ where $n = 1, 2, \ldots$, and $f_T = (2\pi\tau_B)^{-1}$ is approximately equal to the usual cut-off frequency. The magnitude of the resonance peaks decreases with frequency as $2(2\pi f_n \Delta\tau_B)^{-2}$. Thus, it is the dispersion of the minority carries during base transit rather than the average time of flight that determines the extended current gain. Taking into account extrinsic impedances and other effects that are unavoidably present in an actual CT, the above described properties are modified to some extent. For example, the positions of the resonant peaks in the current gain are no longer simple multiples of $f_T$. However, the basic advantage of the CT, namely, the possibility of providing gain at a frequency above $f_T$ and $f_{max}$, is preserved.

DETAILED DESCRIPTION OF SOME PREFERRED EMBODIMENTS

Figure 1:
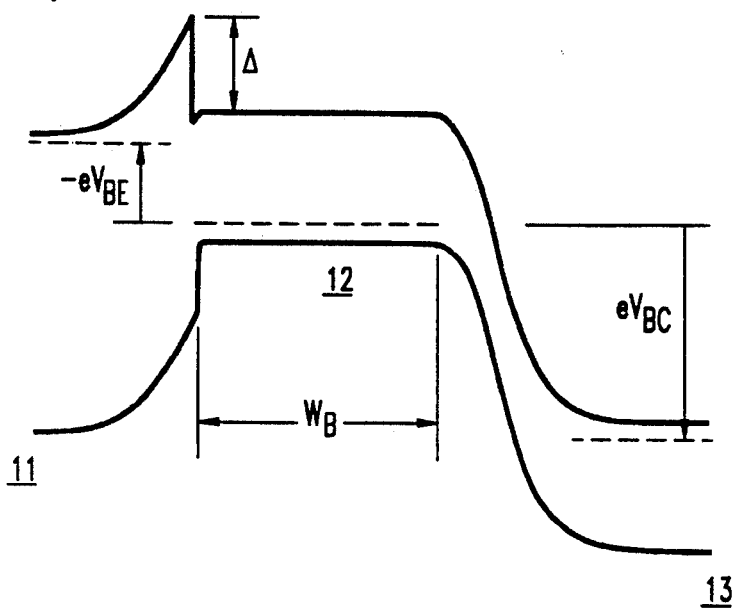
FIG. 1 schematically shows relevant aspects of the band structure of an exemplary CT.

FIG. 1 schematically depicts the band diagram of an abrupt-junction HBT that can, assuming an appropriate choice of parameters, advantageously embody the invention. By an "abrupt-junction" HBT, we mean herein a HBT in which the width of the emitter/base junction "transition" region is small, typically no more than 0.1 $W_B$, frequently only a few crystal layers. The "transition" region is the region in which the relevant band edge drops from the peak of the emitter/base energy barrier to the constant base value. As those skilled in the art will recognize, the exemplary band diagram corresponds to a conventionally biased n-p-n HBT. Numerals 11-13 designate emitter, base and collector, respectively. The base has width $W_B$, voltage $V_{BE}$ is applied between base and emitter, and a voltage $-V_{BC}$ is applied between base and collector. Minority carriers (i.e., electrons in the instant case) are injected into the base over a (desirably abrupt) energy barrier of height $\Delta$. An analogous band diagram can readily be drawn for a p-n-p HBT according to the invention.

Figure 2:
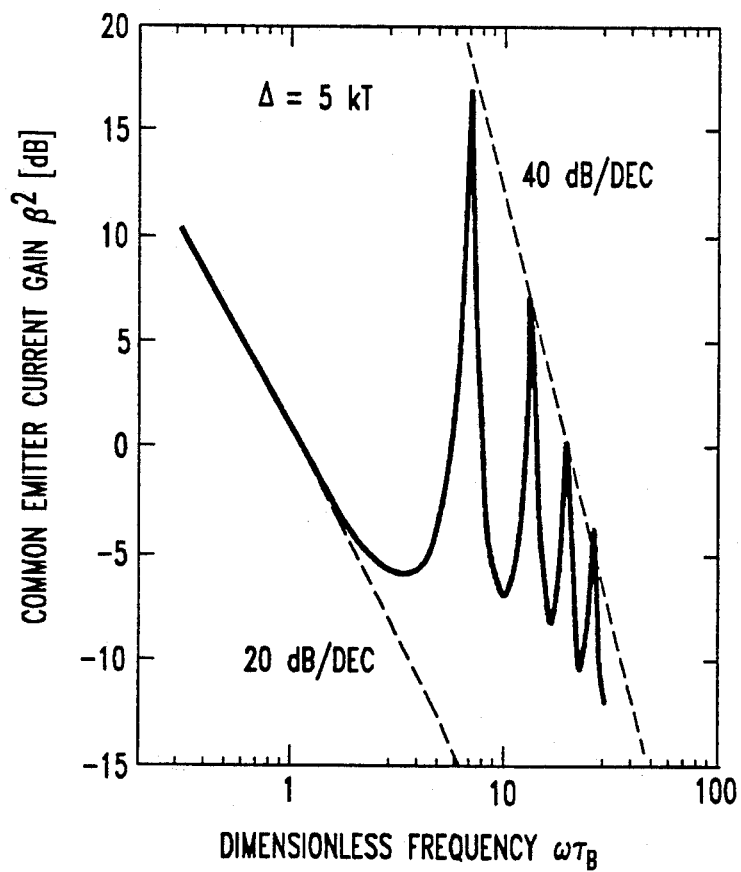
FIG. 2 shows the square of the intrinsic current gain of an exemplary CT as a function of frequency.

FIG. 2 shows the square of the intrinsic common emitter current gain as a function of frequency (in units of $\omega\tau_B$), for $\Delta = 5$ kT, and $\Delta$ and $W_B$ selected such that $\tau_B = 1$ ps. As can be seen, the gain peaks occur approximately at $f_n$, their magnitude decreasing with frequency as $1/f_n^2$. It can be shown that, under the stated conditions, the maximum current gain of the nth peak $(\beta_n)$ is approximately equal to $$2\Delta^2/(n\pi kT)^2.$$

See also A. A. Grinberg, et al., *Applied Physics Letters*, Vol. 60, p. 2770, 1992 (incorporated herein by reference), for a discussion of high frequency current roll-off in a HBT with collisionless propagation of minority carriers across the base.

Figure 3:
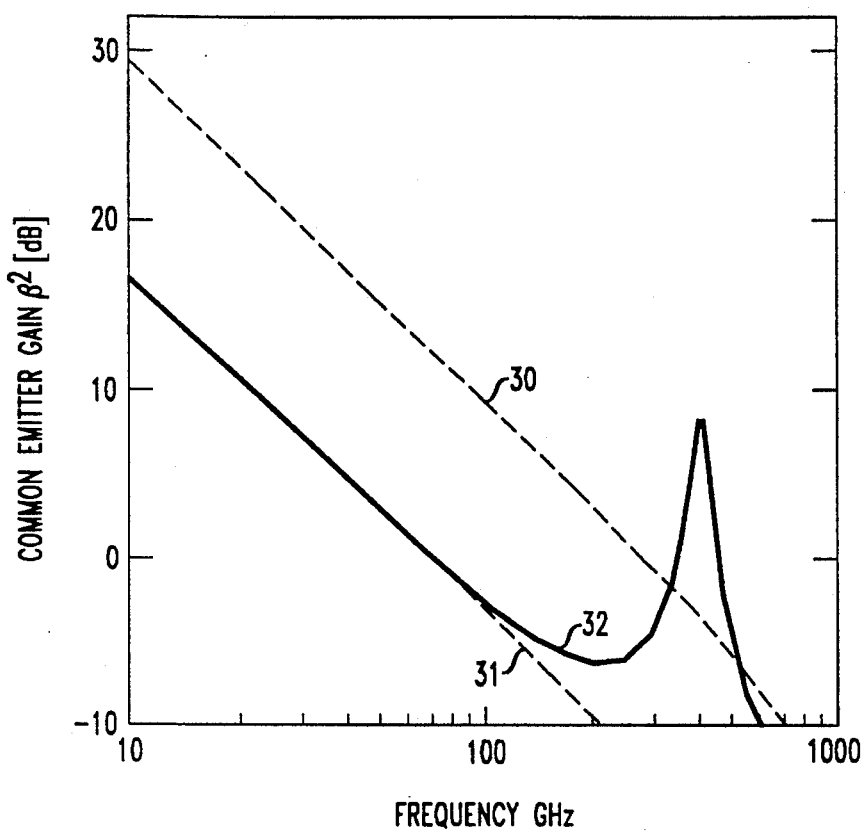
FIG. 3 shows current gain vs. frequency for three different transistors, including an exemplary CT.

FIG. 3 shows intrinsic current gain vs. frequency, all curves including the effect of collector delay $\tau_c = 1$ ps. Curve 30 corresponds to the (unphysical) case of a transistor with zero base delay, 31 to a transistor with diffusive base delay $\tau_D = 2$ ps, and 32 to an analogous CT with $\Delta = 10$ kT and $\tau_B = 2$ ps. The figure clearly demonstrates the existence in the CT of large gain in the frequency range in which not only the diffusive transistor but even the transistor with no base delay at all, are completely damped.

Figure 4:
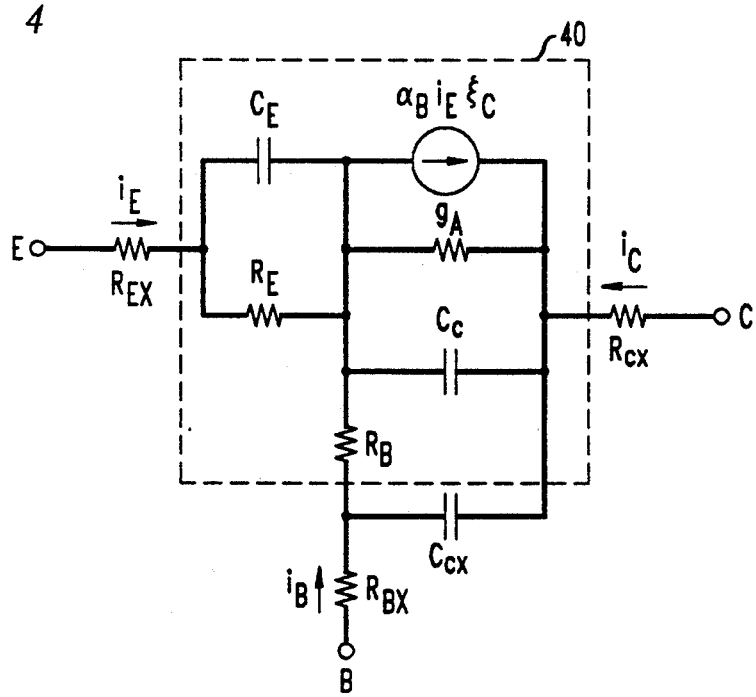
FIG. 4 is an equivalent circuit for an abrupt junction HBT.

We shall next include in our discussion the effects of (unavoidable) extrinsic impedances. FIG. 4 represents an appropriate equivalent circuit of an abrupt junction HBT, wherein dashed line 40 encloses the intrinsic portion of the transistor, and E, B and C refer to emitter, base and collector, respectively. The intrinsic parameters $R_E$ and $C_E$ are the differential resistance and capacitance of the emitter/base junction, respectively, $C_C$ and $g_A$ are the collector junction capacitance and the Early conductance, respectively, $\alpha_B$ and $\xi_c$ are the base and collector transport factors, respectively, and $R_B$ is the intrinsic base resistance. $C_{CX}$ is the extrinsic collector capacitance, and $R_{BX}$, $R_{CX}$ and $R_{EX}$ are the parasitic base, collector and emitter resistances.

Analysis of the equivalent circuit for the case of a CT reveals an unexpected result, namely, the desirability of a relatively large $W_B$. Frequently, the coherency condition can still be met at temperatures below 77K for $W_B = 100$ nm or even larger, and it will frequently be desirable to design a CT such that $W_B$ is relatively large, possibly $\geq 100$ nm. Large $W_B$ is typically desirable because it allows the minority carriers to acquire an optimum phase delay (typically $> \tau$) at frequencies within the contemplated frequency range (e.g., 100 GHz-1 THz). Furthermore, relatively large $W_B$ allows one to attain relatively low base resistances $R_B$ and $R_{BX}$. This is a significant advantage, as those skilled in the art will appreciate. The above expressed preference for relatively large $W_B$ is to be compared to the general prior art teaching to minimize $W_B$ in "ballistic" transistors.

The analysis of the equivalent circuit also indicates that $2\pi f C_c (R_E + R_{EX} + R_{CX} + R_x^{eff})$ desirably is less than 1, where $R^{eff} = R_{CX} (R_E + R_{EX})/(R_B + R_{BX})$. This result indicates that even for $\Lambda >> W_B$, the upper limit of the frequency range in which the transistor can exhibit gain is limited by the parasitics.

As those skilled in the art will know, a phase delay is associated with the current transport through any bipolar transistor. The phase delay can be expressed as the sum of the injection phase delay $\phi$ and the drift delay $\theta$ in the base/collector junction, with $\phi=\phi_E+\phi_B$, where $\phi_E$ and $\phi_B$ are the total transit angles of emitter and base, respectively. It is a significant aspect of the invention that a CT will typically be designed such that $\phi \gtrsim \theta$, with $\phi_B \approx 2\pi f_T \tau_B \gtrsim \pi$ for frequencies above $f_T$ and $f_{max}$. This implies design choices that are contrary to the prior art teachings. For instance, these conditions suggest rather large values of $W_B$ (frequently $\gtrsim 100$ nm), relatively small values of $\Delta$, and use of relatively large effective mass minority carriers. All of the above referred to phase angles can be determined for a given design. For instance, $\theta = W_c/v_s$, where $W_c$ is the width of the collector depletion region, and $v_s$ is the saturated velocity in that depletion region. The emitter phase angle $\phi_E$ is defined only in the limit $\phi_E << \pi$ (typically $\phi_E \lesssim \pi/4$), and in that limit is approximately equal to $2\pi f R_e C_e$.

Figure 5:
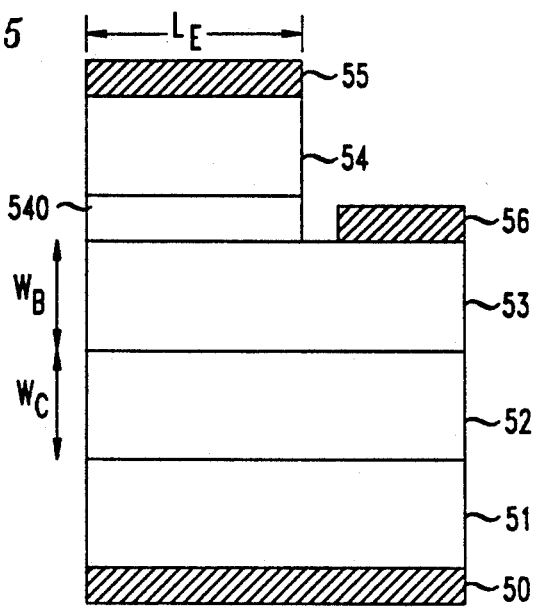
FIG. 5 schematically depicts an exemplary CT.

FIG. 5 schematically shows relevant aspects of an exemplary CT, wherein numerals 50-56 refer, respectively, to the collector contact, collector, collector depletion region, base, emitter, emitter contact and base contact. Numeral 540 refers to the emitter/base space charge layer. The emitter stripe width $L_E$, base width $W_B$ and collector depletion layer width $W_C$ are also indicated. The relevant characteristics of a CT as shown in FIG. 5 were determined from the equivalent circuit of FIG. 4, using the following parameter values: $R_E = 5\Omega \cdot \mu m$, $R_B = 25\Omega \cdot \mu m$, $R_{BX} = 25\Omega \cdot \mu m$, $R_{EX} = 20\Omega \cdot \mu m$, $R_{CX} = 20\Omega \cdot \mu m$, $C_C = 0.5$ fF/$\mu m$, $C_E = 10$ fF/$\mu m$, and $C_{CX} = 1$ fF/$\mu m$; these parameters are given per 1 $\mu m$ of emitter stripe width Z and are based on the assumed dimensions $W_B = 0.1$ $\mu m$, $W_C = 0.1$ $\mu m$, $L_E = 0.5$ $\mu m$, the injection energy $\Delta = 14.4$ meV, and the base layer resistivity $\rho_B = 0.001\Omega \cdot cm$. Furthermore, it was assumed that the device temperature is 4.2K. These parameters can substantially be obtained in, for instance, a p-n-p Si-Ge heterostructure with a wide gap p-type Si emitter, abruptly adjoining a narrow gap n-type $Ge_x Si_{1-x}$ (x~0.1) base. For a heavy hole mass $m = 0.5$ $m_o$, one gets $V_B \sim 10^7$ cm/s, where $m_o$ is the free electron mass and $v_B$ is hole velocity in the base.

Figure 6:
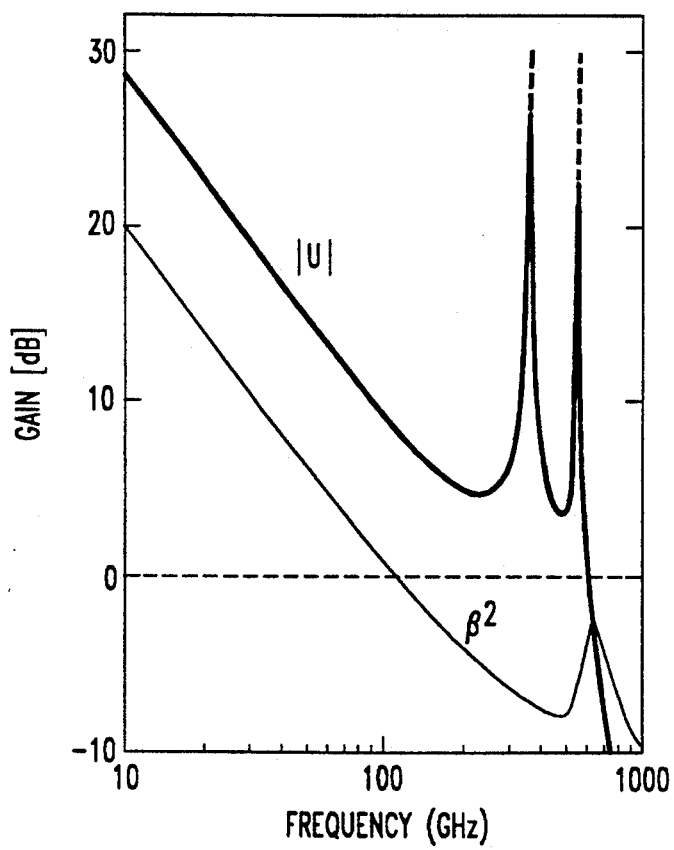
FIG. 6 shows $\beta^2$ and $|U|$ of an exemplary CT as a function of frequency.

FIG. 6 shows results of the numerical analysis. In particular, it shows the absolute values of current gain and unilateral power gain, both as a function of frequency. As can readily be seen, the conventional $f_T$ of the exemplary transistor is about 100 GHz. The figure shows, however, that the transistor is active up to frequencies of about $2\pi f_T$. The analysis revealed that the current gain is largely damped away by the parasites (although a trace of the peak is clearly seen near $f\tau_B \sim 1$), and that the unilateral power gain U in the region between the two peaks in $|U|$ is actually negative, indicating that the transistor is active and the real part of the output impedance $z_{22}^e$ is less than zero in that frequency region.

EXAMPLE

An abrupt junction CT of design substantially as shown in FIG. 5 is made as follows: on a conventional single crystal Si substrate is grown by conventional MBE an epitaxial layer sequence that comprises a 200 nm thick n-type ($10^{19}$ cm$^{-3}$ B) collector layer, a 100 nm thick substantially undoped ($\gtrsim 10^{16}$ cm$^{-3}$) collector depletion layer, a 100 nm thick p-type ($10^{19}$ cm$^{-3}$ As) $Si_{1-x}Ge_x$ (x≈0.1) base layer, a 5 nm thick light p-type ($\lesssim 10^{17}$ cm$^{-3}$ As) Si emitter/base space charge layer, and a 200 nm thick n-type ($10^{19}$ cm$^{-3}$ B) emitter layer. The wafer is patterned by conventional lithography and etching to define a HBT, and emitter, base and collector contacts are provided, all as known in the art. The HBT is cooled to 4.2K and conventional measurements are carried out. The measurements show that the device is a CT, with $\beta$ and U substantially as shown in FIG. 6. Measurements at 15K show little change in behavior. This temperature can readily be reached by means of a commercially available re-circulating He-refrigerator.

We claim:

1. An article comprising a heterojunction bipolar transistor comprising first, second and third semiconductor regions, to be referred to as emitter, base and collector, respectively, and further comprising means for electrically contacting said emitter, base and collector, respectively, the base being intermediate the emitter and collector and having a width $W_B$, the emitter and collector each comprising semiconductor material of a first conductivity type, and the base comprising material of a second conductivity type that differs from the first conductivity type, associated with the transistor being a unilateral power gain (U), a common emitter current gain ($\beta$), conventional cut-off frequencies $f_{max}$ and $f_T$, a minority carrier average injection energy $\Delta$ and a minority carrier average ballistic base transit time $\tau_B$; and associated with the material of the base is an optical phonon frequency $v_{opt}$;

CHARACTERIZED IN THAT a) $kT < \Delta < h v_{opt}$, where T is the transistor absolute operating temperature, k is Boltzmann's constant, and h is Planck's constant;

b) $W_B$ is at least 100 nm;

c) the transistor is an abrupt junction transistor selected such that, at temperature T, $\Delta\tau_B$ is less than about 0.5 $\tau_B$; where $\Delta\tau_B$ is the variance of $\tau_B$; and further is selected such that d) at temperature T, the absolute value of U is greater than unity at least at one frequency above $f_T$.

2. An article according to claim 1, wherein $\Delta$ is at least 3 kT, and wherein the first conductivity type is p-type conductivity.

3. An article according to claim 1, wherein the base comprises material selected from the group consisting of $Si_x Ge_{1-x}$ (x<1) and III/V compound semiconductors.

4. An article according to claim 1, wherein the transistor furthermore is selected such that $\beta$ is greater than unity at least at one frequency above $f_T$.

5. An article according to claim 1, wherein said frequency is in the range 100 GHz–1 THz.

6. An article according to claim 1, comprising means for cooling the transistor to a temperature that is less than or equal to 77K.

7. An article according to claim 6, comprising means for cooling the transistor to a temperature that is less than or equal to about 15K.

* * * * *